United States Patent
Halbritter et al.

(10) Patent No.: US 10,483,439 B2
(45) Date of Patent: Nov. 19, 2019

(54) OPTOELECTRONIC DEVICE WITH SILICON SLICE COVER ARRANGED DOWNSTREAM OF A CONVERSION ELEMENT

(71) Applicant: OSRAM Opto Semiconductors GmbH, Regensburg (DE)

(72) Inventors: Hubert Halbritter, Dietfurt (DE); Britta Göötz, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/316,144

(22) PCT Filed: Jun. 2, 2015

(86) PCT No.: PCT/EP2015/062255
§ 371 (c)(1),
(2) Date: Dec. 2, 2016

(87) PCT Pub. No.: WO2015/185549
PCT Pub. Date: Dec. 10, 2015

(65) Prior Publication Data
US 2017/0125646 A1    May 4, 2017

(30) Foreign Application Priority Data
Jun. 5, 2014  (DE) .................. 10 2014 107 960

(51) Int. Cl.
*H01L 33/44* (2010.01)
*H01L 33/50* (2010.01)
*H01L 33/58* (2010.01)

(52) U.S. Cl.
CPC ............ *H01L 33/502* (2013.01); *H01L 33/44* (2013.01); *H01L 33/58* (2013.01); *H01L 33/507* (2013.01)

(58) Field of Classification Search
None
See application file for complete search history.

(56) References Cited

U.S. PATENT DOCUMENTS

| | | |
|---|---|---|
| 7,196,354 B1 | 3/2007 | Erchak et al. |
| 2005/0067681 A1 | 3/2005 | De Villeneuve et al. |
| 2007/0023085 A1* | 2/2007 | Andrews ........... H01L 21/67126 137/392 |

(Continued)

FOREIGN PATENT DOCUMENTS

| | | |
|---|---|---|
| CN | 2658728 Y | 11/2004 |
| CN | 101611500 A | 12/2009 |

(Continued)

*Primary Examiner* — Bilkis Jahan
(74) *Attorney, Agent, or Firm* — McDermott Will & Emery LLP

(57) ABSTRACT

The invention relates to an optoelectronic component (10) comprising —a radiation-emitting semiconductor chip (2), —a conversion element (8) which is suitable for converting at least one part of the radiation (12) emitted by the semiconductor chip (2) into a converted radiation (13), said converted radiation (13) having a longer wavelength than the emitted radiation (12), and —a cover (9) which is permeable at least to the converted radiation (13) and which follows the conversion element (8) in a main emission direction, wherein —the conversion element (8) comprises a quantum dot converter material (7), —the conversion element (8) is arranged on a cover (9) inner face (15) facing the semiconductor chip, and —the cover has silicon (9) or consists of silicon.

9 Claims, 2 Drawing Sheets

(56) References Cited

U.S. PATENT DOCUMENTS

Figure 1:
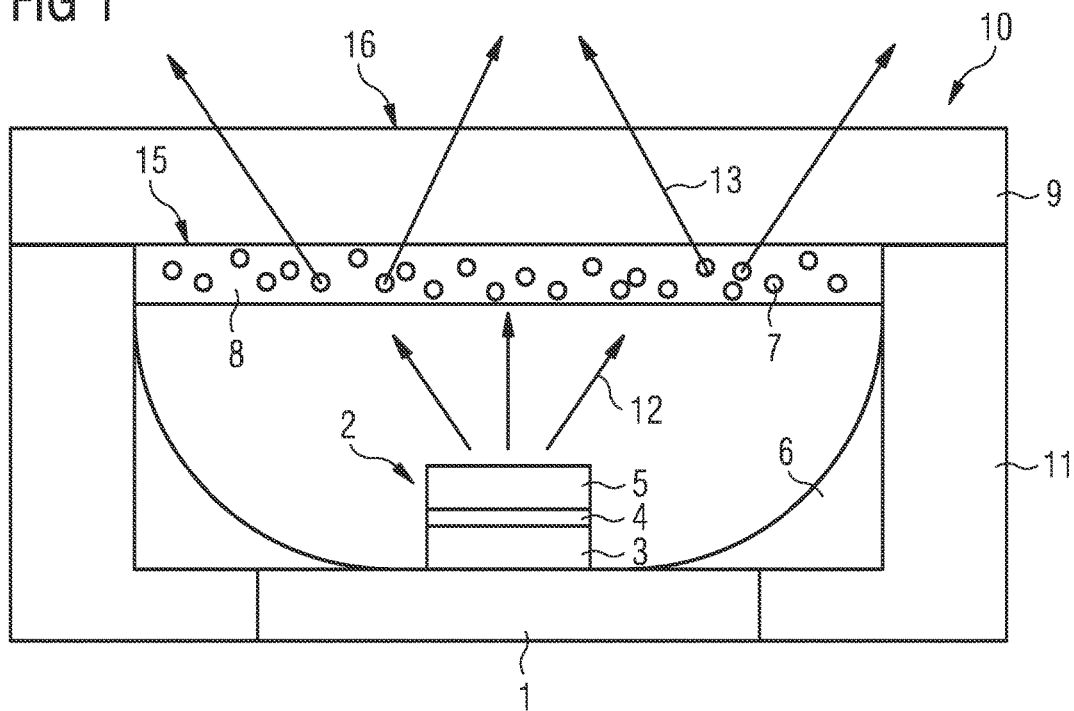

| | | | |
|---|---|---|---|
| 2008/0117500 A1* | 5/2008 | Narendran | H01L 33/507 359/326 |
| 2008/0149166 A1 | 6/2008 | Beeson et al. | |
| 2009/0059588 A1 | 3/2009 | Engl et al. | |
| 2009/0244515 A1* | 10/2009 | Behringer | G01V 8/20 356/4.01 |
| 2009/0256781 A1* | 10/2009 | Kwon | G02B 1/105 345/60 |
| 2010/0084629 A1* | 4/2010 | Park | B82Y 20/00 257/13 |
| 2010/0110728 A1 | 5/2010 | Dubrow et al. | |
| 2011/0001148 A1* | 1/2011 | Sun | H01L 33/60 257/88 |
| 2011/0284885 A1* | 11/2011 | Hong | H01L 33/50 257/88 |
| 2012/0195340 A1* | 8/2012 | Cheon | H01L 33/501 372/50.1 |
| 2013/0277643 A1* | 10/2013 | Williamson | H01L 27/156 257/13 |
| 2014/0014988 A1* | 1/2014 | Schubert | H01L 33/505 257/98 |
| 2014/0049939 A1* | 2/2014 | Kuenzler | F21V 29/63 362/84 |
| 2014/0225132 A1* | 8/2014 | Livesay | H01L 33/641 257/88 |
| 2014/0264419 A1* | 9/2014 | Kim | H01L 33/504 257/98 |

FOREIGN PATENT DOCUMENTS

| | | |
|---|---|---|
| CN | 103219449 A | 7/2013 |
| DE | 4433521 A1 | 3/1995 |
| DE | 102011113963 A1 | 3/2013 |
| EP | 1204151 A1 | 5/2002 |
| EP | 2669350 A1 | 12/2013 |
| JP | 2006049657 A | 2/2006 |

\* cited by examiner

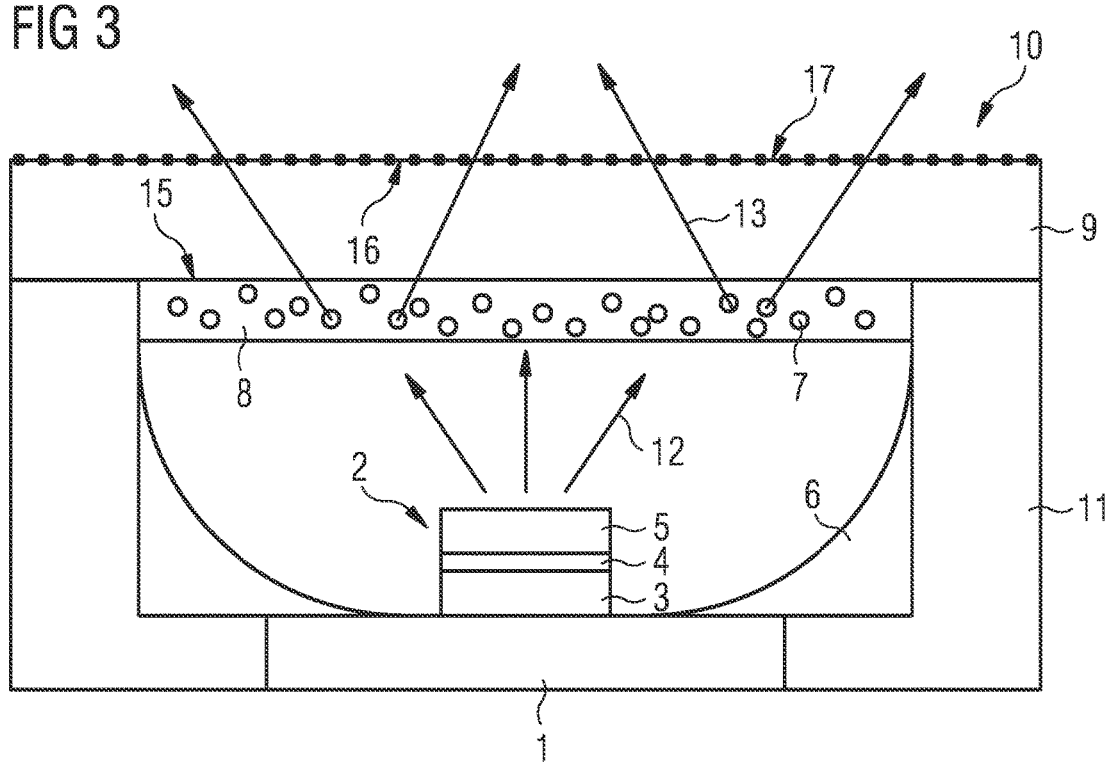
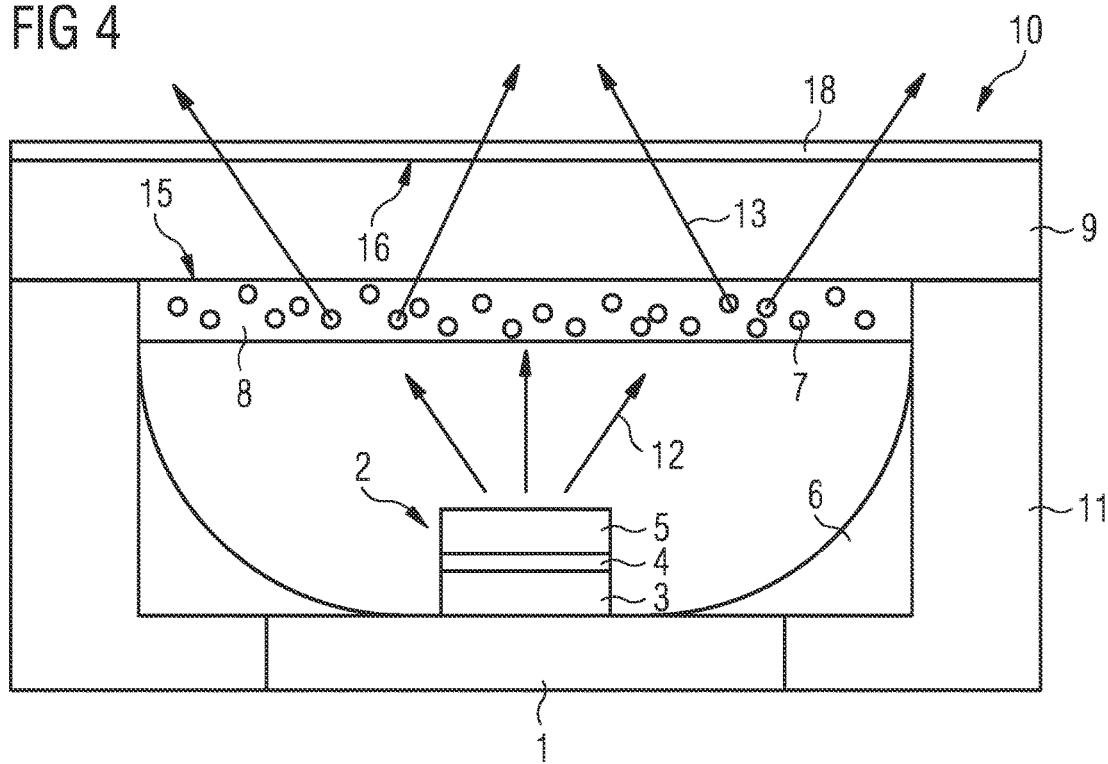

OPTOELECTRONIC DEVICE WITH SILICON SLICE COVER ARRANGED DOWNSTREAM OF A CONVERSION ELEMENT

The invention relates to an optoelectronic device, in particular to an optoelectronic device which emits in the infrared region of the spectrum.

This patent application is a U.S. National Phase Application under 35 U.S.C. § 371 of International Patent Application No. PCT/EP2015/062255, filed on Jun. 2, 2015, which in turn claims priority from German patent application 10 2014 107 960.4, filed on Jun. 5, 2014, the disclosure content of both of which is hereby included by reference.

One problem addressed consists in providing an optoelectronic device which emits in the infrared region of the spectrum and which is distinguished by good heat dissipation, improved optical properties and high long-term stability.

These problems are solved by an optoelectronic device according to independent claim 1. Advantageous configurations and further developments of the invention are the subject matter of the dependent claims.

According to at least one embodiment, the optoelectronic device comprises a radiation-emitting semiconductor chip and a conversion element which is suitable for converting at least part of the radiation emitted by the semiconductor chip into converted radiation, the converted radiation having a longer wavelength than the emitted radiation. In particular, the conversion element may be suitable for absorbing at least part of the emitted radiation and re-emitting radiation of a longer wavelength.

According to at least one embodiment, the optoelectronic device comprises a cover which is transmissive at least for the converted radiation and which is arranged downstream of the conversion element in a main direction of radiation of the radiation emitted by the semiconductor chip. The cover may in particular be applied to a package of the optoelectronic device.

In the case of the optoelectronic device, the conversion element advantageously comprises a quantum dot converter material. A quantum dot converter material contains quantum dots, which may be present in particular in the form of nanocrystals which typically have a particle diameter of between 1 nm and 100 nm, preferably between 1 nm and 20 nm. The quantum dot converter material may in particular contain quantum dots based on compounds of Cd or Pb. For example, the quantum dots contain compounds with at least one of the elements Cd, Pb, Se, Te or Sb.

In the case of the optoelectronic device, the conversion element is advantageously arranged on an inner side of the cover facing the semiconductor chip. The conversion element preferably does not directly adjoin the semiconductor chip.

The conversion element may in particular be formed of a layer of a matrix material in which the quantum dot converter material is embedded. The matrix material is preferably transparent both for the radiation emitted by the optoelectronic semiconductor chip and for the converted radiation generated in the conversion element. The matrix material may in particular be a polymer.

The matrix material may for example comprise a silicone, an epoxide, an acrylate or polystyrene. The layer of the matrix material with the quantum dot converter material embedded therein may in particular be applied to the inner side of the cover.

According to at least one embodiment, the cover of the optoelectronic device comprises silicon or consists of silicon. The cover is preferably a silicon slice, which may in particular be made from a semiconductor wafer consisting of silicon. The cover is preferably around 100 µm to 500 µm thick.

Because the conversion element with the quantum dot converter material is applied onto the inner side of the cover facing the semiconductor chip, the conversion element is advantageously protected by the cover from environmental influences such as for example mechanical damage, penetration of moisture or reaction with oxygen. Furthermore, heat arising in the conversion element during operation of the optoelectronic device may be efficiently dissipated via the cover, which comprises or consists of silicon.

According to at least one embodiment of the optoelectronic device, the radiation-emitting semiconductor chip emits infrared radiation. In particular, the radiation-emitting semiconductor chip may be provided to emit radiation of a wavelength of between 780 nm and 1100 nm. In this configuration, the radiation-emitting semiconductor chip emits in the near infrared region of the spectrum (NIR).

According to at least one embodiment, the converted radiation generated by the conversion element is infrared radiation. In particular, the conversion element may be suitable for converting infrared radiation emitted by the radiation-emitting semiconductor chip into infrared radiation of a longer wavelength.

According to at least one embodiment, the cover is absorbing for the emitted radiation. This may mean in particular that the cover absorbs at least 90 percent, at least 95 percent or even at least 99 percent of the emitted radiation of the semiconductor chip. In this configuration, substantially only the converted radiation is allowed through by the cover. Because the cover comprises or consists of silicon, the absorption of silicon is in particular exploited for absorption of the radiation emitted by the semiconductor chip. Silicon is known to have high absorption for wavelengths of less than around 1100 nm and is substantially transparent for wavelengths of above around 1100 nm.

Preferably, the radiation emitted by the semiconductor chip has a wavelength $\lambda_e$ of <1100 nm, the converted radiation preferably having a wavelength $\lambda_c$ of >1200 nm. In particular, provision is made for the wavelength of the radiation emitted by the semiconductor chip to have a wavelength below the absorption edge of silicon and for the converted radiation to have a wavelength over the absorption edge of silicon, which lies at around 1100 nm. In this way, it is advantageously ensured that the optoelectronic device emits substantially only the converted radiation, while the primary radiation emitted by the semiconductor chip is effectively suppressed by the cover.

According to at least one embodiment of the optoelectronic device, an outer side of the cover remote from the semiconductor chip comprises a pattern for shaping the beam of radiation emitted by the optoelectronic semiconductor device, in particular of that generated in the conversion element. In this configuration, in addition to the previously described functions the cover has the function of a beam-shaping element. The pattern formed on the outside of the cover to shape the beam may in particular be a microlens pattern or a microprism pattern.

According to a further advantageous configuration of the optoelectronic device, an outer side of the cover remote from the semiconductor chip comprises roughening. In this way it is possible in particular to reduce reflection at the boundary surface between the cover and the surrounding medium, in particular air, and in this way to improve radiation outcoupling from the optoelectronic device.

In a further advantageous configuration of the optoelectronic device, an outer side of the cover remote from the semiconductor chip comprises an antireflection coating. The antireflection coating advantageously reduces reflection at the boundary surface between the cover and the surrounding medium and thereby improves radiation outcoupling from the optoelectronic device. The antireflection coating may be an individual layer or a multilayer system of a plurality of individual layers, in particular dielectric layers. Preferably, the antireflection coating has a reflection minimum at the wavelength of the converted radiation.

According to one advantageous embodiment, the cover is connected thermally conductively with a package of the optoelectronic device. The package may for example be formed wholly or in part from a thermally conductive material. In particular, it is possible for at least side walls of the package to comprise a metal or be coated with a metal. In this way, the heat output by the conversion element to the cover may advantageously be dissipated to the package of the optoelectronic device.

According to at least one embodiment, the radiation-emitting semiconductor chip comprises an active layer, which comprises $Al_nGa_mIn_{1-n-m}As$, wherein $0 \leq n \leq 1$, $0 \leq m \leq 1$ and $n+m \leq 1$. An optoelectronic semiconductor chip based on an arsenide compound semiconductor is suitable in particular for emission of radiation in the near-infrared region of the spectrum. The radiation-emitting semiconductor chip may in particular be an IR luminescent diode chip or an IR semiconductor laser chip.

Figure 2:
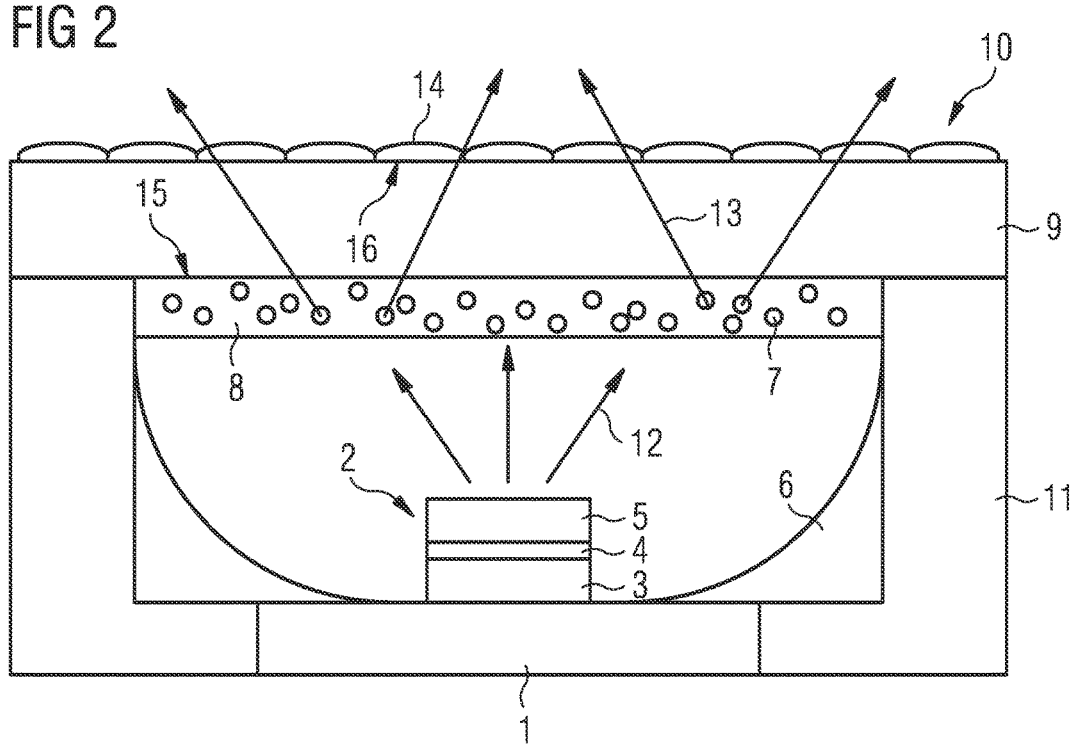

The invention is explained in greater detail below with reference to exemplary embodiments in conjunction with FIGS. 1 to 4, in which:

FIG. 1 is a schematic representation of a cross-section through an optoelectronic device according to a first exemplary embodiment, FIG. 2 is a schematic representation of a cross-section through an optoelectronic device according to a second exemplary embodiment, FIG. 3 is a schematic representation of a cross-section through an optoelectronic device according to a third exemplary embodiment, and FIG. 4 is a schematic representation of a cross-section through an optoelectronic device according to a fourth exemplary embodiment.

In the figures, identical or identically acting components are in each case provided with the same reference numerals. The components illustrated and the size ratios of the components to one another should not be regarded as to scale.

The optoelectronic device 10 illustrated in FIG. 1 comprises a semiconductor chip 2 which is preferably an IR luminescent diode chip which emits in the infrared spectral region. The semiconductor chip 2 comprises an active layer 4. The active layer may for example take the form of a pn-junction, of a double heterostructure, of a single quantum well structure or of a multiple quantum well structure. The term "quantum well structure" here includes any structure in which charge carriers undergo quantization of their energy states by inclusion ("confinement"). In particular, the term quantum well structure does not provide any indication of the dimensionality of the quantization. It thus encompasses inter alia quantum wells, quantum wires and quantum dots and any combination of these structures.

The active layer 4 is for example arranged between an n-type semiconductor region 3 and a p-type semiconductor region 5. In the exemplary embodiment of FIG. 1, the n-type semiconductor region faces a carrier 1 of the semiconductor chip. Alternatively, the semiconductor chip 2 may also be arranged in reverse polarity on the carrier 1. This may in particular be the case when the semiconductor chip takes the form of a "thin-film chip", where a growth substrate used to grow the semiconductor layer sequence is detached from the semiconductor chip.

The semiconductor chip 2 may in particular be based on an arsenide compound semiconductor. In the present context, "based on an arsenide compound semiconductor" means that the epitaxial layer sequence or at least one layer, in particular the active layer, comprises an arsenide compound semiconductor material, preferably $Al_nGa_mIn_{1-n-m}As$, wherein $0 \leq n \leq 1$, $0 \leq m \leq 1$ and $n+m \leq 1$. This material does not absolutely have to exhibit a mathematically exact composition according to the above formula. Instead, it may comprise one or more dopants and additional constituents which do not substantially modify the characteristic physical properties of the $Al_nGa_mIn_{1-n-m}As$ material. For simplicity's sake, however, the above formula includes only the fundamental constituents of the crystal lattice (Al, Ga, In, As), even if these may in part be replaced by small quantities of further substances.

The radiation 12 emitted by the semiconductor chip 2 is preferably radiation in the near infrared region of the spectrum, which may in particular have a wavelength of more than 780 nm and less than 1100 nm.

The semiconductor chip 2 is arranged in a package 11. In the package 11, the semiconductor chip 2 may be arranged on a carrier 1, which is preferably thermally and/or electrically conductive and preferably serves in heat dissipation and/or in electrical contacting of the semiconductor chip 2. The carrier 1 of the semiconductor chip 2 may for example terminate flush with a bottom of the package 11, such that the carrier 1 may advantageously be electrically and/or thermally conductively connected to a printed circuit board or a heat sink in the event of surface mounting of the optoelectronic device 10. The optoelectronic device 10 may in particular be an SMD (Surface Mountable Device).

A reflector 6 may be integrated into the package 11 of the optoelectronic device 10, through which reflector radiation emitted by the optoelectronic semiconductor chip 2 in the lateral direction is advantageously deflected into a main emission direction.

In the optoelectronic device 10 a conversion element 8 is provided for converting at least part of the emitted radiation 12 into converted radiation 13, which has a longer wavelength than the emitted radiation 12. To this end, the conversion element 8 advantageously contains a quantum dot converter material 7. The quantum dot converter material may in particular comprise compounds of Cd or Pb. For example, the quantum dots contain compounds with at least one of the elements Cd, Pb, Se, Te or Sb. The quantum dot converter material 7 may in particular comprise nanocrystals, which are embedded in a matrix material. The matrix material may for example comprise silicone, epoxide, acrylate or polystyrene.

The nanocrystals may for example have sizes of between around 1 nm and 100 nm, preferably between 1 nm and 20 nm. The quantum dot converter material is advantageously distinguished by high quantum efficiency.

The conversion element 8 is suitable in particular for converting the emitted radiation 12 into infrared radiation of a wavelength of more than 1200 nm.

In the optoelectronic device 10, the conversion element 8 is advantageously applied to an inner side 15 of a cover 9 facing the semiconductor chip 2. The cover 9 is for example applied to the package 11 and in this way closes the package 11 at the top thereof. The cover 9 preferably comprises silicon and may consist in particular of silicon. The cover 9 is for example a slice of silicon, which is preferably around 100 μm to 500 μm thick. The use of silicon as the material for the cover 9, which at the same time functions as a carrier for the conversion element 8, in particular has the advantage that heat arising in the conversion element 8 can be absorbed well by the cover 9 and dissipated to the package 11. In other words, the cover 9 functions as a heat sink for the conversion element 8.

Furthermore, the cover 9, which is formed with or from silicon, has the advantage that it may function as an absorber for the radiation 12 emitted by the semiconductor chip 2. In this respect, utilization is made in particular of the fact that silicon has an absorbing action at wavelengths of below around 1100 nm. The cover 9 is therefore able to suppress the unconverted radiation 12 and an emission spectrum of the optoelectronic device 10 is thereby achieved which substantially contains only the converted radiation 13 generated in the conversion element 8. Since silicon has a high level of transparency above its absorption edge at around 1100 nm, the converted radiation 13 is advantageously not or only insignificantly weakened in the cover 9.

The cover 9 preferably seals the package 11 hermetically at the top of the latter, whereby the semiconductor chip 2 is protected from environmental influences, in particular from the penetration of moisture or oxidation under the influence of oxygen. The optoelectronic device 10 is therefore distinguished by high long-term stability.

The second exemplary embodiment of the optoelectronic device 10 illustrated in FIG. 2 differs from the first exemplary embodiment in the configuration of the outer side 16 of the cover 9. In this exemplary embodiment the outer side 16 of the cover is provided with a microlens pattern 14. The cover 9 therefore advantageously has, in addition to its functions as carrier for the conversion element 8, as absorber for the emitted radiation 12, as encapsulation of the package 11 and as heat sink for the conversion element 8, another additional function, namely the optical function of beam shaping of the converted radiation 13 emitted by the optoelectronic device. To produce the microlens pattern 14, it is advantageous for silicon to be used as the material for the cover 9, since this allows production using processes known per se in silicon semiconductor technology. As far as its other configurations and advantageous characteristics are concerned, the second exemplary embodiment corresponds to the first exemplary embodiment and is therefore not explained in any greater detail.

The third exemplary embodiment of the optoelectronic device 10 illustrated in FIG. 3 differs from the first exemplary embodiment illustrated in FIG. 1 in that the outer side 16 of the cover 9 is provided with roughening 17. The roughening 17 may for example be produced by means of an etching process on the outer side 16 of the cover 9.

The roughening 17 has the advantage that reflection losses at the boundary surface between the cover 9 and the surrounding medium are reduced and thus the radiant yield of the optoelectronic device 10 is improved. As far as its other configurations and advantageous characteristics are concerned, the third exemplary embodiment corresponds to the first exemplary embodiment and is therefore not explained in any greater detail.

An alternative option for improving outcoupling of the converted radiation 13 from the cover 9 is illustrated in the exemplary embodiment of FIG. 4. In this exemplary embodiment, an antireflection coating 18 is applied to an outer side of the cover 9 remote from the semiconductor chip 2. The antireflection coating 18 may take the form of an individual layer or of a multilayer system. In particular, the antireflection coating 18 may comprise one or more dielectric layers. As far as its other configurations and advantageous characteristics are concerned, the fourth exemplary embodiment corresponds to the first exemplary embodiment and is therefore not explained in any greater detail.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. An optoelectronic device, comprising:
   a radiation-emitting semiconductor chip, wherein the emitted radiation is infrared radiation having a wavelength of <1100 nm;
   a conversion element comprising a quantum dot converter material suitable for converting at least part of the emitted radiation into converted radiation, wherein the converted radiation from the quantum dot converter material is infrared radiation having a wavelength of >1200 nm; and
   a cover which is substantially transmissive for the converted radiation and which is arranged downstream of the conversion element in a main emission direction,
   wherein the conversion element is arranged on an inner side of the cover facing the semiconductor chip,
   wherein the cover comprises silicon or is a silicon slice comprising an absorption edge, which lies at around 1100 nm, and
   wherein the cover effectively suppresses the emitted radiation.

2. The optoelectronic device according to claim 1, wherein the cover is between 100 μm and 500 μm thick.

3. The optoelectronic device according to claim 1, wherein an outer side of the cover remote from the semiconductor chip comprises a pattern for shaping the beam of radiation emitted by the optoelectronic device.

4. The optoelectronic device according to claim 3, wherein the pattern is a microlens pattern or a microprism pattern.

5. The optoelectronic device according to claim 1, wherein an outer side of the cover remote from the semiconductor chip comprises roughening.

6. The optoelectronic device according to claim 1, wherein an outer side of the cover remote from the semiconductor chip comprises an antireflection coating.

7. The optoelectronic device according to claim 1, wherein the cover is connected thermally conductively with a package of the optoelectronic device.

8. The optoelectronic device according to claim 1, wherein the radiation-emitting semiconductor chip comprises an active layer, which comprises $Al_nGa_mIn_{1-n-m}As$ with $0 \leq n \leq 1$, $0 \leq m \leq 1$ and $n+m \leq 1$.

9. The optoelectronic device according to claim 1, wherein the radiation-emitting semiconductor chip is an IR luminescent diode chip or an IR semiconductor laser chip.

* * * * *